March 29, 1966 D. G. AVIV ETAL 3,243,717

D.C. OPERATIONAL AMPLIFER

Filed March 29, 1962

INVENTORS
DAVID G. AVIV
HAROLD MOREINES
BY Herbert L. Davis
ATTORNEY

United States Patent Office 3,243,717

Patented Mar. 29, 1966

3,243,717

D.C. OPERATIONAL AMPLIFIER

David G. Aviv, New York, N.Y., and Harold Moreines, Springfield, N.J., assignors to The Bendix Corporation, Teterboro, N.J., a corporation of Delaware Filed Mar. 29, 1962, Ser. No. 183,563
3 Claims. (Cl. 330—10)

The invention relates to amplifiers, and in particular, to operational amplifiers.

A conventional electronic operational amplifier is described in Millman and Taub, "Pulse and Digital Circuit," McGraw-Hill, 1956, page 22, and references cited, and comprises an input for receiving and input signal $e_i$, and an impedance $Z_i$, connecting the input to a summing point. An amplifier proper is connected to the summing point and provides a signal $e_o$ at its output. A feedback impedance $Z_f$ connects the output of the amplifier proper to the summing point for applying the output signal $e_o$ to the summing point in opposition to the input signal $e_i$, to provide at the summing point a potential $\epsilon$. The output $e_o$ of the operational amplifier is $$e_o = -\frac{Z_f}{Z_i} \cdot e_i$$

The amplifier proper as used heretofore had a high input impedance approaching infinity and a high gain usually in the range of $10^5$ to $10^7$. A disadvantage of the conventional circuit is that the amplifier proper is subject to drift requiring constant recalibration.

One object of the invention is to provide a novel operational amplifier in which the amplifier proper has a relatively small input impedance which is noncritical.

Another object of the invention is to provide a novel operational amplifier having an amplifier proper in which the high gain is provided with the use of passive elements.

Another object of the invention is to provide novel D.C. operational amplifier that is relatively free from drift.

Another object of the invention is to provide a novel device having essentially an infinite forward loop gain at zero frequencies so that the transfer characteristics of the device are dependent only on the feedback and input networks.

Another object of the invention is to provide a novel D.C. operational amplifier including a pure capacitive reactance feedback impedance and integrating characteristics at low frequencies with only moderate amplifier gain requirements.

Another object of the invention is to provide a novel operational amplifier having, in the amplifier proper, an electronic amplifier with only moderate gain.

The invention contemplates an operational amplifier adapted to receive an input signal $e_i$ to provide an output voltage $e_o$, and having an impedance $Z_i$ connected at its input, and a feedback impedance $Z_f$ and having a transfer characteristic $$\frac{e_o}{e_i} = -\frac{Z_f}{Z_i}$$

The invention includes means for providing voltage pulses corresponding to the error signal $$\frac{e_i Z_f - e_o Z_i}{Z_i + Z_f}$$

and a multi-aperture device having control windings energized by the pulses and excitation windings energized by a source of alternating current and output windings for providing the output voltage $e_o$.

The foregoing and other objects and advantages of the invention will appear more fully hereinafter from a consideration of the detailed description which follows, taken together with the accompanying drawings where several embodiments of the invention are illustrated by way of example. It is to be expressly understood, however, that the drawings are for illustration purposes only and are not to be construed as defining the limits of the invention.

Figure 1:
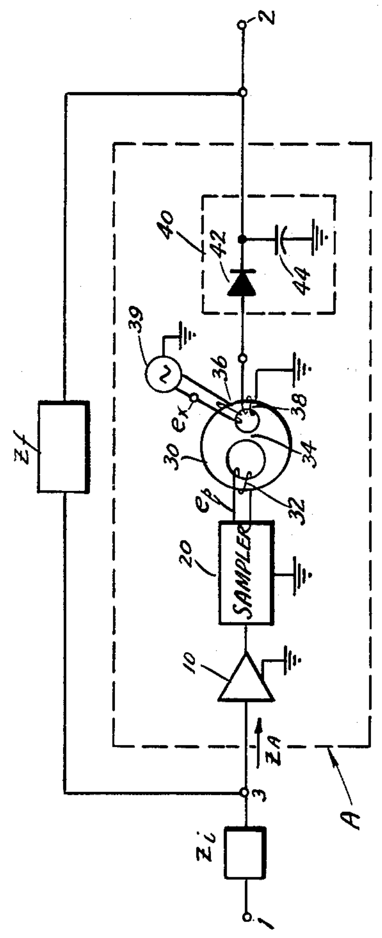
FIGURE 1 is a schematic drawing of one embodiment of a novel operational amplifier constructed according to the invention and using a transfluxor in the amplifier proper.

The novel operational amplifier shown in FIGURE 1 has an input 1 adapted to receive an input signal $e_i$, and a first impedance $Z_i$ connecting input terminal 1 and a summing point 3. An amplifier proper A, connected to summing point 3, provides a signal $e_o$ at its output 2. A feedback impedance $Z_f$ is connected between output 2 and summing point 3 for applying the output signal $e_o$ to summing point 3 in opposition to the input signal $e_i$ to provide an error signal $\epsilon$ corresponding to $$\frac{e_i Z_f - e_o Z_i}{Z_i + Z_f}$$

The output of the operational amplifier is $$e_o = -\frac{Z_f}{Z_i} \cdot e_i \qquad (1)$$

The amplifier proper A has an electronic amplifier 10 with an input impedance $Z_A$ of about 100,000 ohms and a gain of $K_A$ of about 100, and is connected to summing point 3. Amplifier 10 amplifies error signal $\epsilon$ and provides an amplified signal $K_A\epsilon$. A sample 20 is connected to amplifier 10 and receives amplified signal $K_A\epsilon$; and provides a fixed frequency voltage pulse train $e_p$ of sampling frequency $1/T$ and pulse width $\tau$, amplitude modulated in accordance with the amplified error signal $K_A\epsilon$.

Alternatively, sampler 20 may pulse width modulate the pulse train to provide a fixed frequency train of equal amplitude pulses of varying widths $\tau$ in accordance with the applied error signal.

The pulse train $e_p$ from sampler 20 may be expressed in Laplace notation as $$E_p(s) = \frac{1 - e^{-\tau s}}{1 - e^{-Ts}} \cdot K_A E(s) \qquad (2)$$

where:

E$(s)$ is the Laplace transform of error signal $\epsilon$.

If the frequency of the error signal $\epsilon$ is small, compared with the sampling frequency 1/T, the exponentials of Equation 2 may be expanded into power series, and the higher order terms neglected. Thus, the output of sampler 20 is approximately equal to $$E_p(s) \doteq K_A E(s) \frac{\tau}{T} \qquad (3)$$

Output signal $e_p$, expressed above in Laplace notation as $E_p(s)$, from sampler 20 is applied to a control winding 32 of a multi-aperture magnetic device shown here as a transfluxor 30 to increase or decrease the amount of flux $\phi$ in a middle leg 34 of transfluxor 30. Change of flux $\Delta\phi$ in leg 34 as a function of a particular pulse $n$, having an average amplitude $e_p(n)$ is $$\Delta\phi = \frac{1}{N} \int_0^{\tau} e_p(n)\, dt \qquad (4)$$

where:

N is the number of control winding turns.

$e_p(n)$ may be either positive or negative; a positive pulse, for example, increases the flux $\phi$ in leg 34, and a negative pulse decreases the flux $\phi$. The total flux $\phi$ in leg 34 after a pulse $n$ is given by the relationship $$\phi(t)=\frac{1}{N}\int_0^\tau e_p(n)\,dt+\phi_o \quad (5)$$

where:

$\phi_o$ is the flux in leg 34 just prior to pulse $n$.

The Laplace transform of Equation 5 is $$\Phi(s)=\frac{K_1}{s}\cdot E_p(s) \quad (6)$$

where:

$K_1$ is a constant.

The multi-aperture device or transfluxor 30 is a unique, permanent flux-storage device having the following properties:

(a) Indefinitely long memory in the form of the stored flux in the leg 34.
(b) Non-destructive readout, that is, the unit 30 can supply an output signal $e_t$ proportional to the amount of flux stored in the leg 34 without loss of flux.
(c) Ability to integrate, such that the total flux stored in the leg 34 is proportional to the number of applied input pulses $e_p$ to winding 32.

It is this integration property with non-destructive readout, that provides essentially infinite gain at zero frequency, so that the transfluxor 30 may be provided in the operational amplifier A with attendant operational advantages, circuit simplification, and low drift and high gain operational characteristics.

A source 39 applies a high frequency excitation voltage $e_x$ to an excitation winding 36 of transfluxor 30. This produces an output signal $e_t$ on an output winding 38 of transfluxor 30 proportional to the product of the flux $\phi$ in leg 34, and the excitation voltage $e_x$. $e_x$ is, for example, a constant amplitude 10 kc. sinusoid, and $e_t$ is a sinusoid of the same frequency (10 kc.) but amplitude modulated by $\phi$. The ratio $$\frac{e_t}{e_x}$$

is a slow time varying signal proportional to the amplitude modulation of $e_t$ by $\phi(t)$. This modulation, as a function of time, is defined as a new quantity $e_o(t)$, thus, $$\frac{e_t}{e_x}=Ke_o=K_2\phi \quad (7)$$

where:

K is a constant of proportionality, and
$K_2$ is a constant, depending on the number of turns of excitation and output winding.

Equation 7 may be put in Laplace notation; and substituting Equations 6 and 3 in 7.

$$2E_o(s)=K_2\Phi(s)=K_2\frac{K_1}{s}K_AE(s)\frac{\tau}{T}=\frac{K_AK_TE}{s}(s) \quad (8)$$

where:

$$K_T=K_1K_2\frac{\tau}{T}$$

Signal $e_t$ from output winding 38 is applied to a rectifier circuit 40 having, for example, a diode 42 and a capacitor 44, which provide a slow time varying output signal $e_o$ at terminal 2 proportional to the amplitude modulation of $e_t$. The diode 42 is oriented such that the polarity of output signal $e_o$ is opposite that of input signal $e_i$.

Figure 2:
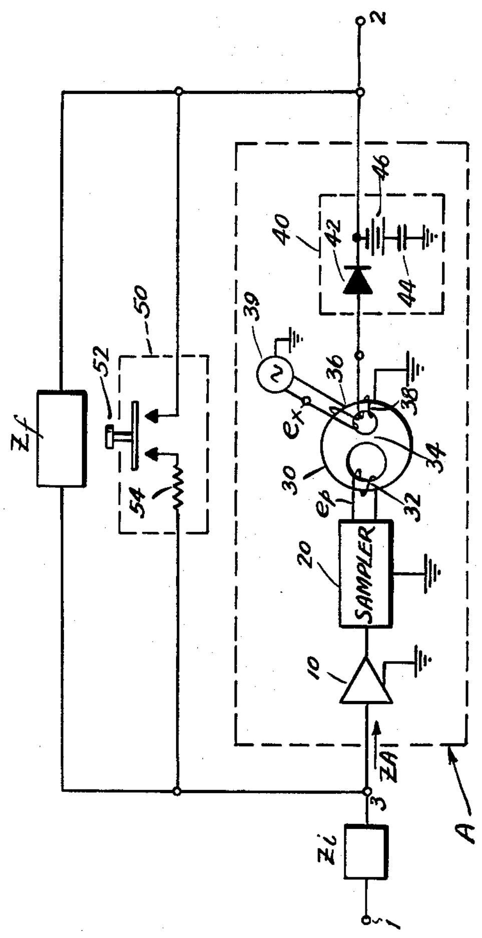
FIGURE 2 is a schematic drawing of a second embodiment of a novel transfluxor operational amplifier constructed according to the invention.

Output signal $e_o$ is applied to summing point 3 through feedback impedance $Z_f$. Input signal $e_i$ is also applied to summing point 3 through series impedance $Z_i$. The operational amplifier characteristics of the circuit of FIGURE 2 are made apparent by summing the currents at summing point 3

$$\frac{\epsilon}{Z_a}+\frac{\epsilon-e_i}{Z_i}+\frac{\epsilon-e^o}{Z_f}=\Phi \quad (9)$$

Bearing in mind that $$E(s)=\frac{E_o(s)}{K_AK_T/s} \quad \text{(from 8)}$$

and substituting in Equation 9 and solving for $$\frac{e_o}{e_i}$$

in Laplace notation, $$\frac{E_o(s)}{E_i(s)}=-\frac{Z_f(s)}{Z_i(s)}\left\{\frac{1}{1-\frac{s}{K_AK_T}\left[1+\frac{Z_f(s)}{Z_a(s)}+\frac{Z_f(s)}{Z_i(s)}\right]}\right\} \quad (10)$$

The parameters are chosen such that the bracketed term in the denominator has no poles within the range of frequencies of interest except at the origin. If the frequency of input signal $e_i$ is very small, then $s$ in the above equation is also very small, and by increasing the amplifier gain $K_A$, the bracketed term in the denominator drops out and $$\frac{E_o(s)}{E_i}\doteq-\frac{Z_f(s)}{Z_i(s)} \quad (11)$$

Thus, the transfer characteristics of the circuit of FIGURE 1 is dependent only upon the series and feedback network parameters $Z_i$ and $Z_f$ in accordance with the well known theory of operational amplifiers.

The operational amplifier of FIGURE 1 has been described as receiving a negative signal. It can be made to receive positive signals by orienting the diode 42 in the opposite direction. It can also be modified to accommodate input signals $e_i$ that are both positive and negative, as shown in FIGURE 2, a bias potential 46 in rectifier circuit 40, and a reset circuit 50 having a switch 52 and a protecting resistor 54. The value of bias 46 is equal to the anticipated maximum amplitude input signal $e_i$ in a given polarity direction, which, in the circuit of FIGURE 2 is positive. Potential 46 and reset circuit 50 bias transfluxor 30 at a quiescent operating point so the amplifier proper A has a quiescent output signal $e_{oq}$. Thus, the output $e_o$ may fluctuate in both a positive and negative direction about the quiescent output signal $e_{oq}$.

The amplifier of FIGURE 2 is biased as follows. In the absence of an input signal, switch 52, which is manually operated, is closed applying the potential 46 to error junction 3. This, in turn, provides a quiescent output signal $e_{oq}$ at terminal 2 equal to, but of opposite polarity to, the potential of bias 46. Switch 52 is opened and input signal $e_i$ may be applied to input 1. A negative input signal will increase the output signal above quiescence $e_{oq}$ and a positive input signal will decrease output signal below quiescence $e_{oq}$. As the output $e_o$ is always positive because of the bias of diode 42, $e_i$ may take any positive value as long as the $e_o$ produced by a positive $e_i$ does not exceed $e_{og}$. The reset circuit 50 may be dispensed with when $Z_f$ is resistive, but is necessary when $Z_f$ is purely capacitive.

In some instances, it may be desirable to avoid the use of an amplifier such as 10, in which event the error signal $\epsilon$ at summing point 3 is applied directly to sampling circuit 20 and an input impedance $Z_s$ to sampler 20 is the input impedance to the amplifier proper A.

There are many different values of the circuit parameters shown in FIGURE 1 for which the circuit will function satisfactorily. Since the circuit parameters may vary according to the design for any particular application, the following circuit parameters are included for the circuit of FIGURE 1 by way of example only.

$Z_i$=100K ohms resistance
$Z_f$=10mf capacitance $\phi \leqslant -e_i \leqslant 5$ volts
$Z_A$ of 10: 100,000 ohms
$K_A$ of 10: 100 (Gain change from 50–250 showed no appreciable change in integration)
Frequency of 20: 50,000 p.p.sec. of 20: 10 $\mu$sec.
Transfluxor 30: RCA type XF3006
Control winding 32: 100 turns
Excitation winding 36: 10 turns
Output winding 38: 10 turns
Source 39: 30 kc. square wave
Diode 42: 1N100
Capacitor 44: .01 $\mu$f.

While two embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. An amplifier, including:
amplifying means having an input terminal and an output terminal;
a first impedance for receiving an input signal to provide a first signal at an output of the first impedance;
feedback impedance means connected to an output of the amplifier and having an output for providing a second signal proportional to the amplifier output signal;
means connecting the output of the first impedance means and the output of the feedback impedance means to the input terminal of said amplifying means for summing the first signal and the second signal to provide a summation signal to the input terminal of said amplifying means;
means connected to the output terminal of said amplifying means for providing a pulse train in accordance with the output signal;
a transfluxer having an excitation winding energized by a source of excitation, a control winding connected to the pulse train means and energized by the pulse train so as to provide in the transfluxer a total stored flux proportional to the applied pulses, and an output winding providing output signals proportional to the total stored flux provided by the pulse train;
and rectifying means connected to the output winding for rectifying the output signal to provide the amplifier output signal.

2. An amplifier including:
amplifying means having an input terminal and an output terminal;
a first impedance for receiving an input signal and providing a first signal at an output of the first impedance;
feedback impedance means connected to an output of the amplifier and having an output for providing a second signal in opposition to the first signal and proportional to the amplifier output signal;
summing means connecting the output of the first impedance and the output of the feedback impedance means to the input terminal of said amplifying means;
means connected to the output terminal of said amplifying means for providing a pulse train in accordance with the first and second signals;
a transfluxer means having a transfer characteristic of $K/S$, said transfluxer means including an excitation winding energized by a source of excitation, a control winding for receiving the pulse train to produce a stored flux proportional to the applied pulses, and an output winding providing an amplifier output signal proportional to the total stored flux and equal to the transfer characteristic operating on the received pulse train.

3. A direct current amplifier, comprising:
a first impedance means having at least two terminals with one terminal adapted to receive an input signal and to provide a first output signal at the other terminal;
feedback impedance means having an input connected to an output of the amplifier for providing a second signal at an output of the feedback impedance means acting in opposition to the first signal;
means connecting the first output signal at the other terminal of the first impedance to the second signal at the output of the feedback impedance means for summing the first and second signals to provide a summation signal;
amplifier means having an input terminal connected to the summing means for amplifying the summation signal at an output terminal of the amplifier means;
a circuit means connected to the output terminal of the amplifier means to receive the amplified signal and provide a voltage pulse train of a predetermined frequency and pulse width amplitude modulated in accordance with the amplified signal, the frequency of the pulse train being considerably greater than the frequency of the summation signal;
a transfluxer having a middle leg, a control winding, an excitation winding and an output winding, the control winding being connected to the circuit means for receiving the pulse train to control the flux in the middle leg so as to provide a total amount of flux stored in the middle leg proportional to the applied pulses;
a high frequency signal source connected to and applying a constant amplitude high frequency signal to the excitation winding and providing an output signal at the output winding proportional to the total amount of the flux stored in the middle leg;
and rectifying means connected to the output winding for rectifying the output signal and including bias means biasing the transfluxer operational amplifier in the absence of an input signal at a predetermined level to provide an amplifier output signal.

References Cited by the Examiner

UNITED STATES PATENTS

| | | | |
|---|---|---|---|
| 2,164,383 | 7/1939 | Burton. | |
| 2,818,555 | 12/1957 | Lo | 340—174 |
| 2,901,555 | 8/1959 | Klinkhamer et al. | 330—10 X |
| 2,901,636 | 8/1959 | Torrey et al. | 330—8 X |
| 2,948,844 | 8/1960 | Morgan | 330—8 X |
| 3,058,068 | 10/1962 | Hinrichs et al. | 330—10 |

ROY LAKE, *Primary Examiner.*

NATHAN KAUFMAN, *Examiner.*